United States Patent
Aksamit

(10) Patent No.: US 7,626,434 B2
(45) Date of Patent: Dec. 1, 2009

(54) LOW LEAKAGE STATE RETENTION CIRCUIT

(75) Inventor: Randy J. Aksamit, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 11/731,226

(22) Filed: Mar. 30, 2007

(65) Prior Publication Data

US 2008/0238510 A1 Oct. 2, 2008

(51) Int. Cl.
*H03K 3/289* (2006.01)
*H03K 3/356* (2006.01)

(52) U.S. Cl. ............... 327/202; 327/203; 327/208; 327/218

(58) Field of Classification Search .......... None
See application file for complete search history.

(56) References Cited

U.S. PATENT DOCUMENTS

| | | | |
|---|---|---|---|
| 6,492,854 B1 * | 12/2002 | Ku et al. ............... | 327/202 |
| 6,639,827 B2 * | 10/2003 | Clark et al. ............... | 365/154 |
| 6,775,180 B2 | 8/2004 | Biyani | |
| 6,956,421 B1 * | 10/2005 | Schuelein ............... | 327/201 |
| 7,221,205 B2 * | 5/2007 | Kinkade et al. ............ | 327/203 |
| 2004/0051574 A1 * | 3/2004 | Ko et al. ............... | 327/218 |
| 2004/0090256 A1 * | 5/2004 | Cho ............... | 327/202 |

* cited by examiner

*Primary Examiner*—Tuan Lam
(74) *Attorney, Agent, or Firm*—Ryder IP Law; Douglas J. Ryder

(57) ABSTRACT

In general, in one aspect, the disclosure describes an apparatus comprising a low leakage latch to store a state of a circuit during inactive periods. The state is transferred to the low leakage latch upon receipt of an inactive pulse. A buffer is used to receive the state from an output of the low leakage latch and to isolate the state. State restore circuitry is used to restore the state to the circuit when the circuit returns to an active mode. The state restore circuitry is used to receive the isolated state and to restore the state upon receipt of an active pulse.

15 Claims, 2 Drawing Sheets

LOW LEAKAGE STATE RETENTION CIRCUIT

BACKGROUND

Flip-flops are often used as the basic storage element in circuit design. When a circuit is not in an active mode it is desirable to reduce the power provided to the circuit while maintaining the state of the circuit. The circuit may be placed in a reduced power mode (e.g., sleep, drowsy) where the power to a portion of the circuit may be turned off. However, the circuitry (e.g., flip-flops) that maintains the state of the circuit may receive power during the reduced power state. The circuitry that maintains the state may need to be low leakage circuitry (e.g., thick gates, long channels, high threshold voltage, reverse bias) since the state may be maintained therein for a period of time.

When the circuit enters a low power mode the clock signal may be deactivated and the circuit may transfer the state to low leakage latches (e.g., balloon latch). The state may be transferred from the active latches to the low leakage latches by pulsing a signal (e.g., low power, low leakage, sleep) to the low leakage latches. After the state is transferred the power provided to the circuit may be turned off with the exception of the power provided to the low leakage latch. When the circuit is ready to become active, the state needs to be restored to the circuit. After the power supply is restored to the circuit, a signal (e.g., restore, active) may be asserted to enable transfer circuitry to transfer the state back to the active latches.

BRIEF DESCRIPTION OF THE DRAWINGS

The features and advantages of the various embodiments will become apparent from the following detailed description in which.

DETAILED DESCRIPTION

Figure 1:
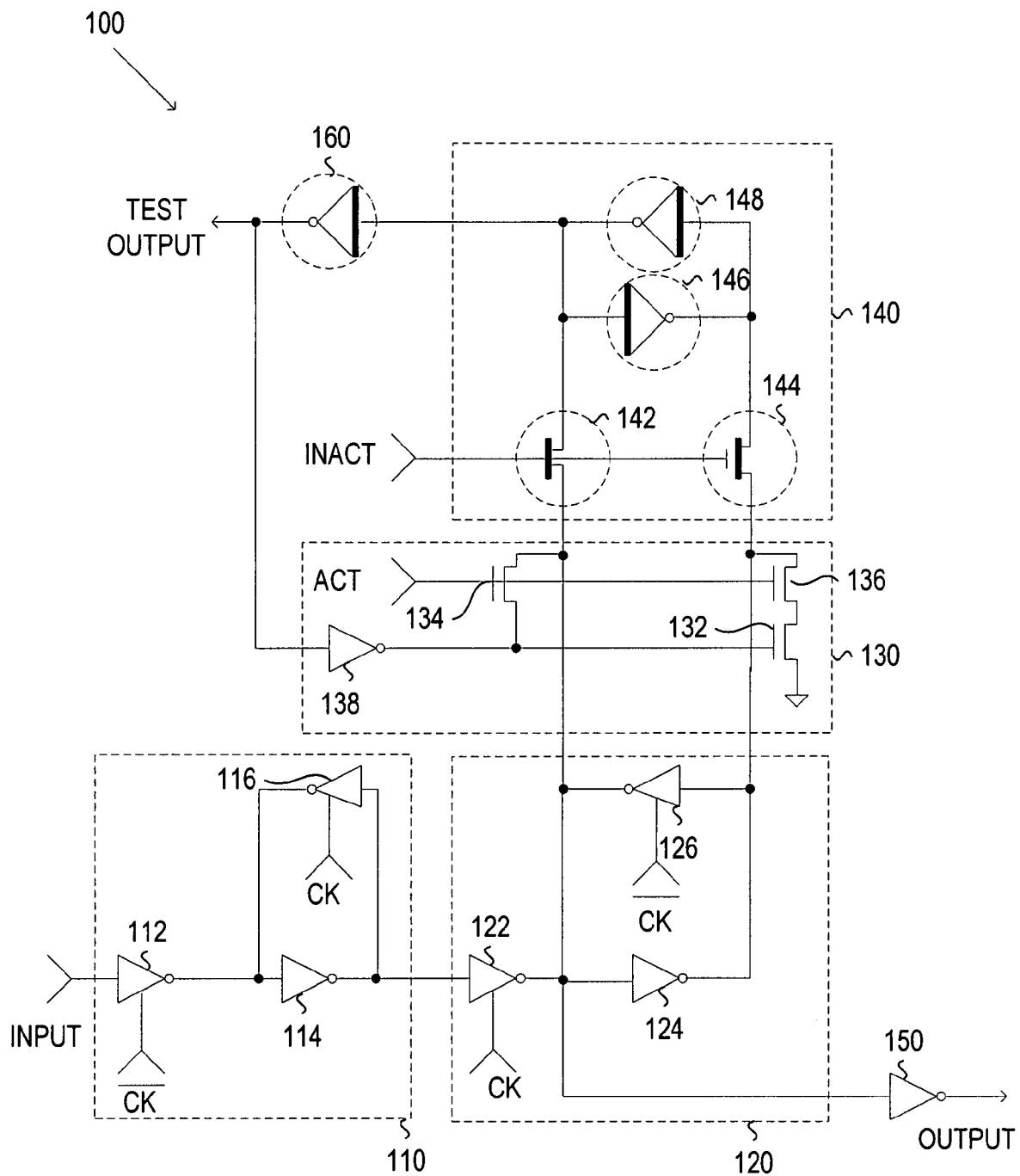
FIG. 1 illustrates an example low leakage state retention circuit, according to one embodiment.

FIG. 1 illustrates an example low leakage state retention circuit 100. The circuit 100 includes a master latch 110, a slave latch 120, state restore circuitry 130, a balloon latch 140, and an isolation buffer 160.

The master latch 110 may include first, second, and third inverters 112, 114, 116. The first inverter 112 may receive data and be controlled by an inverted clock signal (clockbar). When active the first inverter 112 may invert the data signal and provide an inverted data signal to the second inverter 114. The second inverter 114 may invert the inverted data signal and provide the data signal to the third inverter 116. The third inverter 116 may be controlled by a clock signal, and when active invert the data signal and provide the inverted signal to the second inverter 114. The second and third inverters 114, 116 are cross coupled and are used to store the state. The state is provided from second inverter 114 to the slave latch 120. The slave latch 120 may include first, second, and third inverters 122, 124, 126 configured in the same arrangement as the master latch 110. However, the first and the third inverters 122, 126 may be controlled by the clock and clockbar respectively (opposite from the master latch 110). The output of the first inverter 122 which is an inverted data signal may be output from the slave latch 120 and be inverted by inverter 150 prior to being processed by additional circuitry (not illustrated).

The master latch 110 and the slave latch 120 are illustrated as being tri-state latches that receive both the clock and the clockbar signals. The latches 110, 120 are in no way limited thereto. Rather, any number of latch styles/implementations can be used without departing from the current scope. For example, the inverters 116, 126 need not receive clock signals. Furthermore, the first inverter 112 and the first inverter 122 are illustrated as receiving the clockbar and clock signals respectively but are not limited thereto. For example, the first inverter 112 and the first inverter 122 could receive the clock and clockbar signals respectively without departing from the current scope.

The state restore circuitry 130 may include first, second and third transistors 132, 134, 136 and an inverter 138. The balloon latch 140 may include first and second transistors 142, 144 and first and second inverters 146, 148. The isolation buffer (e.g., inverter) 160 may be used to invert the output of the balloon latch 140 prior to the output being provided to the state restore circuitry 130.

The balloon latch 140 is used to retain the state of the circuit during inactive periods when the circuit is powered down. During these periods the balloon latch 140 needs to remain powered in order to maintain the state. Accordingly, the balloon latch 140 may leak during inactive periods. Furthermore, the inverter 160 that is directly connected to the balloon latch 140 may also leak during inactive periods even though it is not powered. The components (transistors, inverters) that may be leaking during inactive periods are identified with a circle. The circuit may remain inactive for a period of time and thus the state may need to be maintained in the balloon latch 140 for a period of time. In order to reduce the amount of power required to maintain the state during the inactive periods, the leaky components (the ones circled) may be low leakage components. The low leakage components 142, 144, 146, 148, 160 are illustrated as being thick gate components, but are in no way intended to be limited thereto. Rather, the low leakage components may be long channel components, high threshold voltage components, reverse bias components, other types of low leakage components, or some combination thereof without departing from the scope.

The operation of the balloon latch 140 may be controlled by a signal indicating that the circuit 100 is going into an inactive mode (e.g., low power, low leakage, sleep, deep sleep, drowsy). The inactive signal (INACT) may be provided to the first and the second transistors 142, 144. When the inactive signal is activated (e.g., set to 1, set high), the first and second transistors 142, 144 will be activated (turned on) so that the data stored in the slave latch 120 is transferred to the balloon latch 140. The output from the second inverter 124 is provided to the input of the second inverter 148 and the output from the third inverter 126 is provided to the input of the first inverter 146. The cross coupled inverters 146, 148 store the state therein. The first and second transistors 142, 144 act as pass transistors that enable the state to be passed from the slave latch 120 to the cross coupled inverters 146, 148.

The output of the balloon latch 140 may be provided to the state restore circuitry 130 via the inverter 160. The inverted output may be provided to the inverter 138. The output of the inverter 138 (same as the output of the balloon latch 140) may be provided to the first and second transistors 132, 134 (gate of first transistor 132 and first terminal of second transistor 134). The operation of the state restore circuitry 130 may be controlled by a signal indicating that the circuit 100 is returning to an active mode. The active signal (ACT) may be provided to the second and the third transistors 134, 136 (gate of each). When the active signal is pulsed (e.g., set to 1, set high) the second and third transistor 134, 136 are turned on, and one of these may pass a restore signal (e.g., ground) to the slave latch 120 depending on the state provided from the balloon latch 140 via the inverter 160.

If the state provided from the balloon latch 140 is a low signal (e.g., 0) the first transistor 132 will be inactive (turned off). Thus, the restore signal will be provided to the slave latch 120 via the second transistor 134. The restore signal will be provided to the output of the third inverter 126 and the input of the second inverter 124. Accordingly, a low state is written to the slave latch 120.

If the output provided from the balloon latch 140 is a high output signal (e.g., 1) the first transistor 132 will be active (turned on). Thus, the restore signal will be provided to the slave latch 120 via the first and the third transistors 132, 136. The restore signal will be provided to the input of the third inverter 126 and the output of the second inverter 124. Accordingly, a high state in written to the slave latch 120.

While not illustrated, the circuit 100 is provided with at least one power source ($V_{CC}$). The same power source may be provided to the various elements of the circuit 100 or different power sources may be provided to different elements. When the circuit 100 goes into an inactive mode the power provided to the master and slave latches 110, 120, the state restore circuitry 130, and the inverters 150, 160 may be removed. The power may be removed from these components by, for example, gating (blocking) the power to these components or by turning the power source off. The balloon latch 140 still receives power when the circuit 100 is in an inactive mode. The balloon latch 140 may have a supplemental power source ($V_{CC-SUP}$) or the $V_{CC}$ may still be provided (not gated) to the balloon latch 140. If separate power supplies are utilized ($V_{CC}$, $V_{CC-SUP}$) the voltages may be the same or may be different.

Figure 2:
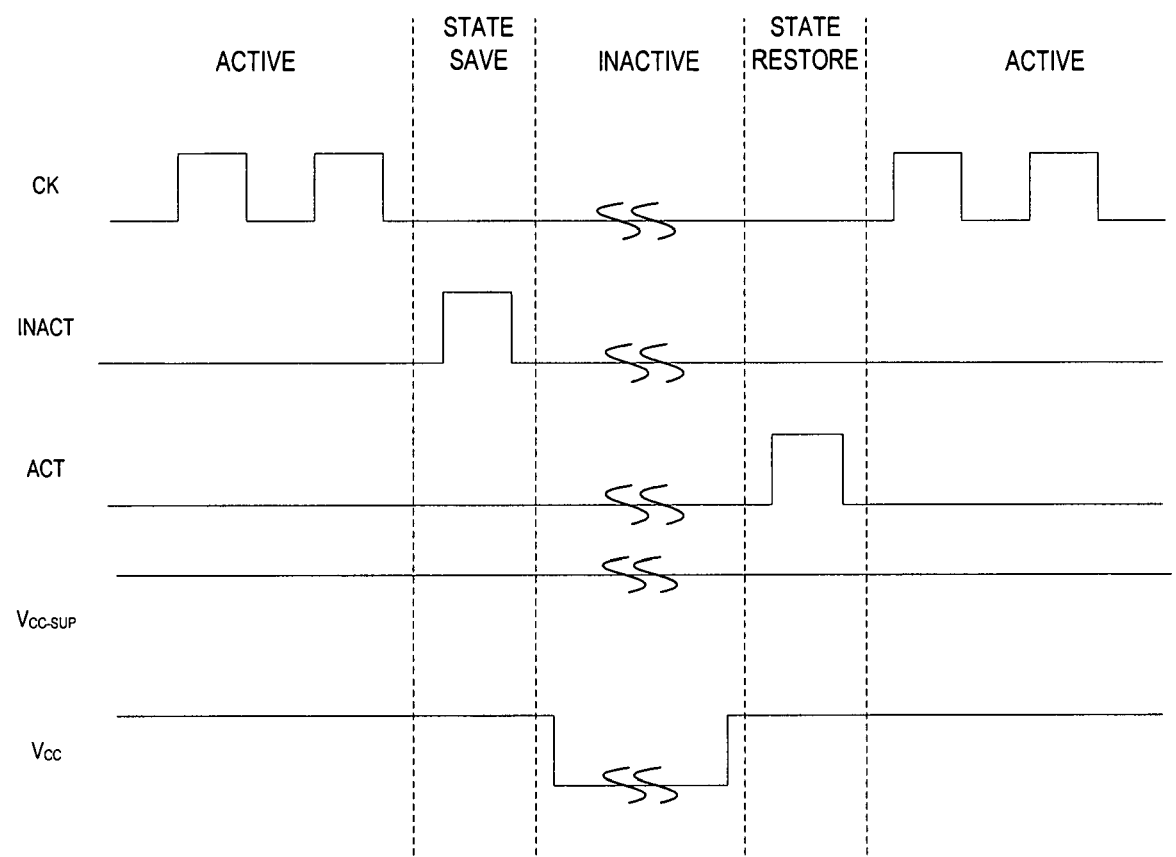
FIG. 2 illustrates an example timing diagram for the circuit of FIG. 1, according to one embodiment.

FIG. 2 illustrates an example timing diagram associated with the circuit 100 of FIG. 1. When the circuit 100 is in active mode the clock signal is received and the $V_{CC}$ is provided to the active circuitry (master latch 110, slave latch 120, state restore circuitry 130, inverters 150, 160) and the $V_{CC-SUP}$ is provided to the low leakage state retention circuitry (balloon latch 140). When the circuit 100 is ready to enter an inactive mode, the clock signal is discontinued and the inactive signal is pulsed. The pulsing of the inactive signal transfers the state from the slave latch 120 to the balloon latch 140 (state save mode). During an inactive mode, the $V_{CC}$ is powered down while the $V_{CC-SUP}$ is maintained. When the circuit 100 is ready to return to active mode, the $V_{CC}$ is provided to the active circuitry and the active signal is pulsed which transfers the state back to the slave latch 120 (state restore mode). Once the circuit 100 returns to the active mode the clock signal is continued.

As illustrated, the active signal is pulsed (e.g., set high, set to 1) after the $V_{CC}$ is provided to the circuit 100 but is in no way limited thereto. Rather, the active signal may be pulsed at any time (before or during powering of the $V_{CC}$) as long as the pulse remains on (e.g., high, 1) for some amount of time after $V_{CC}$ is restored.

Referring back to FIG. 1, it should be noted that the cross coupled invertors 146, 148 used to capture the state in the balloon latch 140 during inactive (e.g., power down) mode are electrically isolated by thick-gate inverter 160 and thick-gate pass transistors 142, 144 from the state restore circuitry 130. Accordingly, there is no substantial leakage path through the state restore circuitry 130 and the state restore circuitry 130 does not contribute any substantial leakage because it is turned off during power down mode. As such, the components (transistors 132, 134, 136 and inverter 138) in the state restore circuit 130 need not be low leakage components (which are weak drivers) in order to reduce power consumption during inactive modes. Rather, the transistors 132, 134, 136 can be standard transistors that can overdrive the slave latch 120 after power is fully restored and thus substantially eliminate the impact that noise on the clock signals may have on state restoration.

The state restore circuitry 130 and the balloon latch 140 are illustrated as being connected to a slave latch 120 and receive the state from and return the state to the slave latch 120. The design of the circuit 100 is not limited thereto. For example, the circuit may contain only a single latch (e.g., master latch 110) and the state restore circuitry 130 and the balloon latch 140 may be connected thereto and receive the state therefrom and return the state thereto without departing from the scope.

The circuit 100 illustrates the use of negative channel devices (e.g., NMOS) but is not limited thereto. For example, positive channel devices (e.g., PMOS) could be used and the ACT and INACT signals could be pulsed to low (0) without departing from the scope.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus comprising
a low leakage latch to store a state of a circuit during inactive modes, wherein the state is to be transferred to the low leakage latch upon receipt of an inactive pulse, wherein the low leakage latch includes pass transistors to receive the inactive pulse, wherein the pass transistors are to pass the state from the circuit upon receipt of the inactive pulse;
a buffer to receive the state from an output of the low leakage latch and to isolate the state; and
state restore circuitry to restore the state to the circuit when the circuit returns to an active mode, wherein the state restore circuitry is to receive the isolated state from the buffer and is to restore the state upon receipt of an active pulse, wherein the state restore circuitry includes a first, second and third transistor, wherein the first and second transistors are to receive the isolated state and the second and third transistors are to receive the active pulse, wherein the second transistor is to provide a restore signal when the isolated state is low and wherein the first and third transistors are to provide the restore signal when the isolated state is high.

2. The apparatus of claim 1, wherein the state restore circuitry is electrically isolated from the low leakage latch during the inactive modes.

3. The apparatus of claim 1, wherein the state restore circuitry is to overwrite the circuit after the circuit is powered on.

4. The apparatus of claim 1, wherein the low leakage latch includes thick gate devices.

5. The apparatus of claim 1, wherein the low leakage latch includes long channel devices.

6. The apparatus of claim 1, wherein the low leakage latch includes high threshold voltage devices.

7. The apparatus of claim 1, wherein the low leakage latch includes a plurality of cross coupled inverters to store the state.

8. The apparatus of claim 1, wherein the restore signal is a low signal.

9. The apparatus of claim 1, wherein the active signal is to be active for some period of time after power is returned to the circuit for an active mode to ensure the state is restored to the circuit.

10. The apparatus of claim 1, wherein the buffer is a low leakage inverter.

11. A circuit comprising
   a first latch;
   a second latch including pass transistors and cross coupled inverters, wherein the pass transistors are coupled between the first latch and the cross coupled inverters and are used to pass a state from the first latch to the cross coupled inverters upon receipt of an inactive pulse, wherein the cross coupled inverters are to store the state during inactive periods, and wherein the pass transistors and the cross coupled invertors are low leakage components;
   a buffer to receive the state from an output of the second latch and to isolate the state, wherein the buffer is a low leakage component; and
   state restore circuitry to receive the isolated state from the buffer and to provide a low signal to the first latch from one of two outputs upon receipt of an active pulse, wherein the isolated state received is used to select an appropriate output for the low signal, and wherein the first latch is to restore the state based on the appropriate output of the low signal, wherein the state restore circuitry includes a first, second and third transistor, wherein the first and second transistors are to receive the isolated state and the second and third transistors are to receive the active pulse, wherein the second transistor is to provide the low signal when the isolated state is low and wherein the first and third transistors are to provide the low signal when the isolated state is high.

12. The circuit of claim 11, wherein upon return to an active mode the active pulse is to be maintained for some period of time after power is returned to the circuit so that the state captured in the second latch is written to the first latch.

13. The circuit of claim 11, wherein the state restore circuitry is to overwrite a state captured in the first latch upon activation.

14. The circuit of claim 11, wherein the first transistor has a gate to receive the isolated state and a first terminal coupled to ground, the second transistor has a gate to receive the active pulse and a first terminal to receive the isolated state, and the third transistor has a gate to receive the active pulse and a first terminal coupled to the first transistor.

15. The circuit of claim 11, wherein the first latch is a tri-state latch.

\* \* \* \* \*